United States Patent

Calligaro et al.

[11] Patent Number: 5,710,739
[45] Date of Patent: Jan. 20, 1998

[54] READING CIRCUIT FOR MEMORY CELLS

[75] Inventors: Cristiano Calligaro, Torre D'Isola; Roberto Gastaldi, Agrate Brianze; Paolo Rolandi, Volpedo; Guido Torelli, S. Alessio, all of Italy

[73] Assignee: SGS-Thomson Microelectronics, S.r.l., Agrate Brianza, Italy

[21] Appl. No.: 476,547

[22] Filed: Jun. 6, 1995

[30] Foreign Application Priority Data

Aug. 31, 1994 [EP] European Pat. Off. ............ 94830415

[51] Int. Cl.$^6$ ............................................. G11C 7/00
[52] U.S. Cl. ............... 365/205; 365/189.05; 365/207; 365/208; 365/210
[58] Field of Search ...................... 365/205, 189.01, 365/210, 225.6, 207, 208, 189.05

[56] References Cited

U.S. PATENT DOCUMENTS

| | | | |
|---|---|---|---|
| 5,257,236 | 10/1993 | Sharp | 365/189.04 X |
| 5,416,371 | 5/1995 | Katayama et al. | 365/205 X |
| 5,457,657 | 10/1995 | Suh | 365/205 |
| 5,477,497 | 12/1995 | Park et al. | 365/205 |
| 5,561,621 | 10/1996 | Devin et al. | 365/154 X |

FOREIGN PATENT DOCUMENTS

| | | |
|---|---|---|
| 0400724 | 12/1990 | European Pat. Off. . |
| 57-123589 | 8/1982 | Japan . |

*Primary Examiner*—Do Hyun Yoo
*Attorney, Agent, or Firm*—Robert Groover; Betty Formby; Matthew Anderson

[57] ABSTRACT

A read circuit for memory cells which has two legs, each having, in cascade with one another, an electronic switch (SW1,SW2), an active element (T1,T2), feedback connected to the active element in the other leg to jointly produce a voltage amplifier, and a switch load element (L1,L2). Each active element is driven through a high-impedance input circuit element.

6 Claims, 2 Drawing Sheets

READING CIRCUIT FOR MEMORY CELLS

This invention relates to circuits which are included in memory cell devices and integrated thereto, and in particular, to a circuit for reading such cells.

A growing demand for greater computing capacity from the consumer market, and the strive to fill this demand by the manufacturers of computers and peripheral units, has inevitably established a need for faster access to data stored in both volatile and non-volatile memories. This demand is compounded by the need to reduce the supply voltage in order to cut down power consumption.

Thus, a very much up-to-date and pressing problem is the provision of circuitry which is capable of accessing stored information within a shorter time and with a power consumption that would meet the present commercial requirements.

Furthermore, the state of the art draws a distinction between the problems connected with reading from memories which use differential cells and those connected with memory reading by the reference cell technique.

FIG. 1 shows an architecture which is commonly employed to read from memories which employ differential cells. Differential cell is typically taken here to mean a circuit of the bistable type or a pair of floating-gate MOS transistors.

A characterizing feature of differential cells is that they would store data in the "true" and "complementary" forms thereof. In the instance of a bistable type of circuit, this is accomplished directly since it has two complementary outputs, whereas with the two transistors, these must be programmed in a complementary manner.

The schematic of FIG. 1 comprises a block which contains the array of memory cells and, by appropriate decoding, connects to the pre-charge blocks through so-called bit lines (lines which are connected to the memory cells in one column). Since a large capacitance is associated to a bit line and is due primarily to the cells connected therein, it becomes necessary, before the reading or "sensing" step can be carried out, to pre-charge the line to a voltage level which allows such reading to be correctly carried out. This is achieved by the use of pre-charge blocks.

After the bit line has been pre-charged, one proceeds to the reading step proper. This step is completed by the sensing block picking up at its inputs (in1 and in2) a voltage or current signal, to then supply an output signal either to an amplifier block or a storage element.

The Figure brings out the decode and address circuits required to select a memory cell for the reading operation. The problem of high-speed sensing is addressed in several ways. There are basically two types of approaches: the voltage-mode sensing and the current-mode sensing. The former uses, as the input variable, a voltage which is usually generated by a load connected to the bit lines. In this case, the sensing function is one of amplifying the voltage differential which establishes between the straight bit line and the complementary one through a voltage amplifier, such that a sufficient voltage value can be output to drive an output buffer. The latter type tries instead to detect the data contained in the addressed memory cell based on whether a current is being flowed through the bit line. Here too, an amplification is mandatory, and this is achieved by means of a current amplifier, while a second amplifier stage is provided to convert the amplified current to a voltage.

A prior art of particular relevance is that disclosed by E. Seevinck, P. J. Van Beers and H. Ontrop in "Current-Mode Techniques for High-Speed VLSI Circuit with Application to Current Sense Amplifier for CMOS SRAM's", IEEE Journal of Solid State Circuit, Vol. 26, No. 4, Apr. 1991.

In the read circuit proposed therein, and shown in FIG. 2, the approach is one of current-mode sensing. During the sensing operation, the "cell" block (consisting in this case of a static RAM differential cell) draws current through one or the other of its terminals connected to the bit lines (either D or its complemented), according to the value of the data stored therein. This drawn current results in the current through one of the two transistors T1 and T2 (specifically, that connected to the terminal where the current draw occurs) being changed (decreased). This change can be regarded for all effects as a current signal. The two transistors T1 and T2 at the heart of the amplification jointly form a feedback loop. By reason of this loop, to a decrease in the current in the left-hand (or right-hand) leg there will correspond an increase in the other leg, in turn producing a further decrease in the former, and so forth.

The pair of n-channel transistors A1, A2 connected in a diode configuration ensure pre-charging of the bit line capacitances, while the pair N1, N2 is effective to convert the amplified current within the circuit to voltage. The output voltage signal is picked up from the nodes out1 and out2.

The circuit in FIG. 2 owes its success to being to some extent unaffected by bit line capacitance (this is achieved by keeping the bit line charged at an optimum operating voltage through the two load transistors A1, A2, and at the low impedance that the pair ensure), but it is beset with two significant drawbacks. Firstly, the presence of four transistors in series in each leg (A1, T1, S1, N1 and A2, T2, S2, N2) restricts the dynamic range of the amplifier operation, which will therefore require a high supply voltage. Secondly, its immunity to bit line capacitance is only sufficient within a limited range of values, outside of which the circuit has speed limitations; the impedance value of the two load transistors A1 and A2 actually cannot be made so low, both by reasons of occupation of area and power dissipation.

The problems which beset reading by the reference cell technique will now be discussed.

Reading by reference cells utilizes a non-volatile memory cell which is to structurally identical to the memory cell selected by the decode blocks; except that the selected cell may be written into or not (i.e., have a high or low threshold), the reference cell will be always erased (low threshold). Thus, the read circuit will be comparing a low threshold cell (thereby drawing a nominal current as is typical of the physical characteristics thereof) to a cell which may have either a low or a high threshold, depending on previous programming. Obviously, the selected cell will draw a current which is substantially the same as that drawn by the reference cell when the threshold is low, and no current when the threshold is high.

A read circuit supplying the output stages with either a high or a low logic value according to whether the selected cell is, in threshold terms, similar to or different from the reference cell.

A generic read arrangement using a reference cell is shown in FIG. 3. The concept underlying this technique is one of comparing the selected generic cell (which may have a high or a low threshold), on the one side, to a reference cell which is at all times virgin, and as such is always drawing the nominal current that characterizes it, on the other side.

The reason why the reading is performed by comparing a selected cell to a reference cell is that in this way a constantly virgin cell can be made available which, in the fabrication of the integrated circuit, will track the same process variations as the cells in the array.

Actually, this reading technique by the reference cell would not consist of comparing one cell, whichever this may happen to be, to a single reference cell, but rather of relating that bit line which contains the cell to be read to the reference bit line. On completion of the decoding step, therefore, two cells will have been selected in the same row, namely the cell to be read and the reference cell. Accordingly, although the comparison is made to a single reference cell, talking in terms of reference bit line may be more appropriate.

The reference bit line does solve the problems arising from process variations. In fact, with the memory array occupying a fairly large area, the risk of variations in physical and electrical parameters between cells from process tolerances is quite high, and it is for this reason that reference bit lines are resorted to. Once the row (word line) is selected, it is from this row that the reference bit line cell and the selected memory cell will be taken into consideration, such that the two cells are allocated on the same axis.

The advantage of reading by the technique which provides for the use of a reference cell, compared with differential cell reading (wherein the data is stored into two memory cells in its true and complementary forms), is basically that less silicon area is occupied. Connected to the bit lines, especially in large-size (4 Mbits, 16 Mbits) storage devices, are the drains of several thousand cells; the junction capacities associated with the drains of such cells sum together to attain several picofarads of overall capacitive load. Thus, one of the most pressing problems encountered is that of the bit line common node: in order to vary the voltage, a large current and/or a long time is required. Usually, prior to the reading step proper, a so-called "pre-charging" step is again carried out which is directed to pull the bit line node to an optimum voltage level for completion of the reading step.

In reading a cell which has the same threshold voltage as the reference cell, a privileged reading and a more difficult reading are to be faced. Where the selected cell has a high threshold voltage (and threfore, no current flowing through it), the comparison to the reference cell is easily done. But the comparison of two cells having a low threshold is less easy. In fact, the current flowing through the two cells is the same, and the sensing circuitry will be responsible for detecting this state of affairs.

Known from the technical literature are a number of circuits for reading memory cells by the reference cell technique, but their use is tied to the supply voltage whose value, as mentioned above, tends to be pushed further down in present day applications.

The underlying technical problem of this invention is to provide a read circuit for memories with differential cells which can also be used, by appropriate dimensioning of the components, for memory reading by the reference cell technique, and which has in both of these applications improved data reading speed and low-voltage operation features over those of prior circuits.

In the instance of the reading with reference cells, improved latitude for decision is also desirable when low current draw cells are read.

These technical problems are solved by a read circuit as indicated above and defined in the characterizing parts of the appended claims to this specification.

The features and advantages of a read circuit according to the invention will be apparent from the following description of an embodiment thereof, given by way of example and not of limitation with reference to the accompanying drawings.

Figure 4:
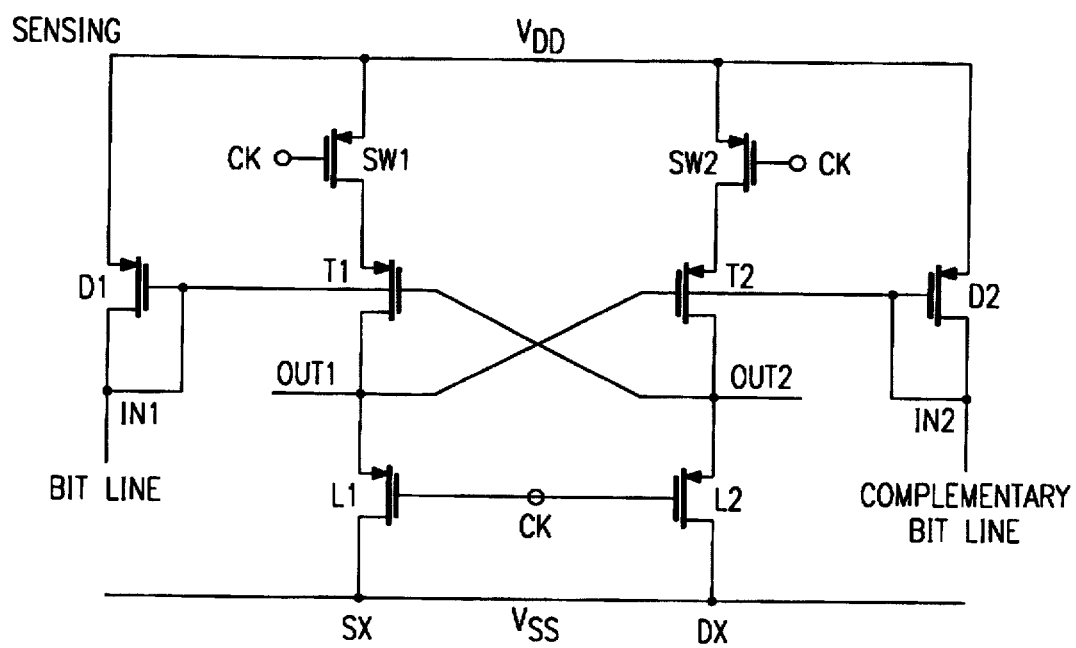
FIG. 4 shows a circuit according to the invention for reading memory cells.

FIG. 4 shows a schematic of a read circuit according to the invention. The inputs are the drains/gates of the diode-connected transistors D1 and D2. These are accessed by a current signal from the underlying bit lines.

For improved performance, structures may be used which allow the bit line voltages to be held substantially constant during a sensing operation, such as a "cascode", not shown.

When the inputs are formed by the diodes D1 and D2, the amplifier proper comprises transistors SW1, SW2, T1, T2, L1 and L2. The signal CK is used to disable or enable the amplifier; while the bit lines are being pre-charged, the amplification will be disabled, whereas, in the sensing mode the circuit is enabled (CK=0). The disabling is directed to limit the consumption by the sensing circuit during operations which do not involve reading.

The transistors SW1 and SW2 being applied the signal CK function, therefore, as two electronic switches.

The transistors T1 and T2, being connected into a loop, constitute a voltage amplifier, whilst the transistors L1 and L2 form switch load elements.

Consider now the differential memory cell embodiment.

In this case, the circuit should be matched, that is, the elements in the left-hand leg should be physically the identical of their corresponding elements in the right-hand leg. Based also on the considerations made in the aforementioned article, it can be stated that the currents flowed through the transistors SW1, T1 and L1 (and likewise, those flowed through SW2, T2 and L2) are substantially the same, so that one can talk in terms of left-hand and right-hand leg currents.

Consider the current amplifier without the diode-connected input transistors D1 and D2. Thanks to the provision of the loop formed by the transistors T1 and T2, an increased current in the left-hand leg (SX) will result by reaction in a decrease of the current in the right-hand leg (DX) which produces, in turn, a further increase in the left-hand leg, and so on. Assuming that a current variation $\Delta i$ is placed on the left-hand leg, the phenomenon can easily be expressed by a numerical series, as follows:

Current variation through the left-hand leg, $$\Delta i + (AB)\Delta i + (AB)^2 \Delta i + \ldots = \Delta i \Sigma_{i=0}^{\infty}(AB)^i \quad (1)$$

Current variation through the right-hand leg, $$B\Delta i + B(AB)\Delta i + B(AB)^2 \Delta i + \ldots = B\Delta i \Sigma_{i=0}^{\infty}(AB)^i \quad (2)$$

where, B is the current (negative) gain from the left-hand leg to the right-hand leg, and A is the (negative) gain from the right-hand leg to the left-hand leg. It is readily inferred from the above formulae that an upward variation of the current in the left-hand leg will reflect in a progressive increase of the current in the left-hand leg itself and a progressive decrease of the current in the right-hand leg.

The formulae (1) and (2) hold for small current variations; in the steady state condition, saturation will obviously occur because of non-linear phenomena due to the dynamic limitation of the circuit, also tied to the supply voltage. In the steady state, current will tend to flow through one of the two legs only.

The amplifying phenomenon just described is triggered by a current variation at either the diode D1 or diode D2. Since the memory is structured for the differential mode, upon reading there will always occur a current $I_{cell}$ in one of the two bit lines and no current in the complementary bit line. This will cause a current variation in just one of the two legs of the sensing circuit to thereby trigger the above amplifying phenomenon.

Figure 1:
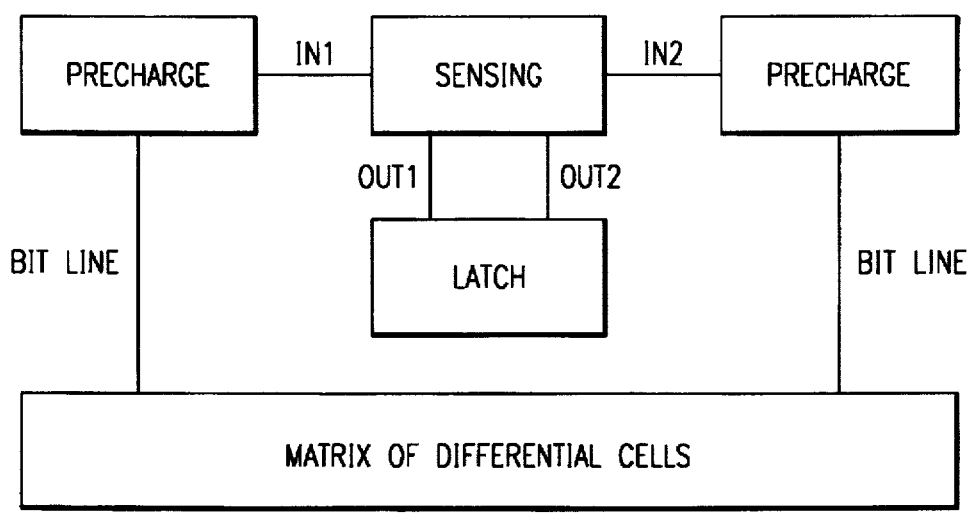
FIG. 1 is a block diagram of circuit portions for reading from a memory with differential cells.
Figure 2:
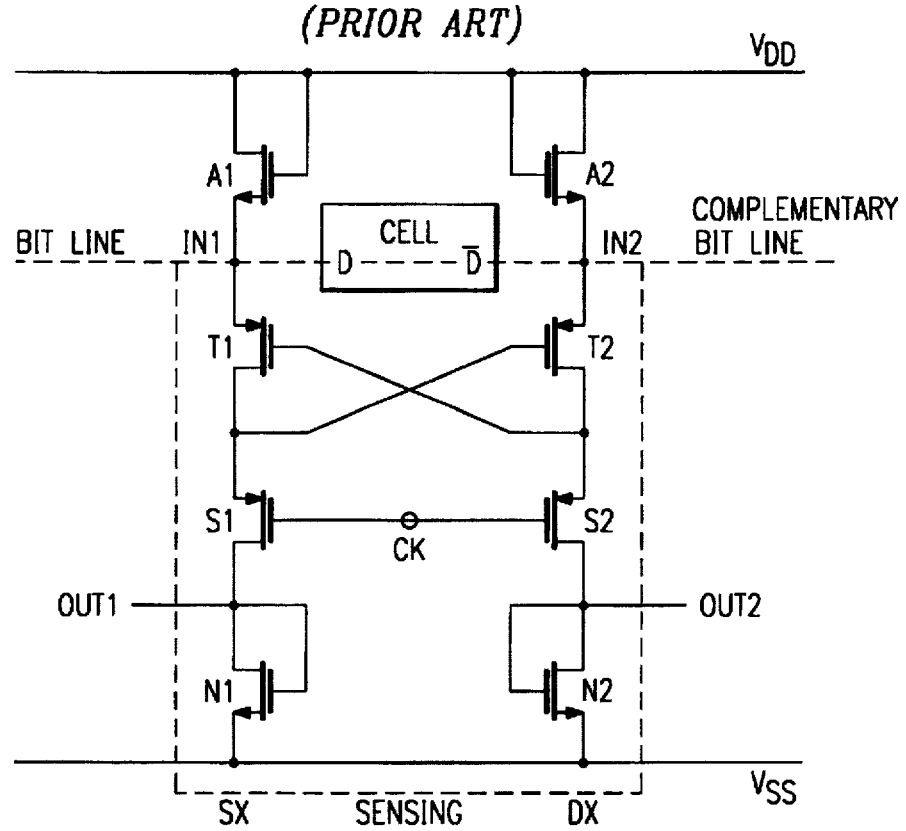
FIG. 2 shows a conventional current amplification circuit for reading differential memory cells.
Figure 3:
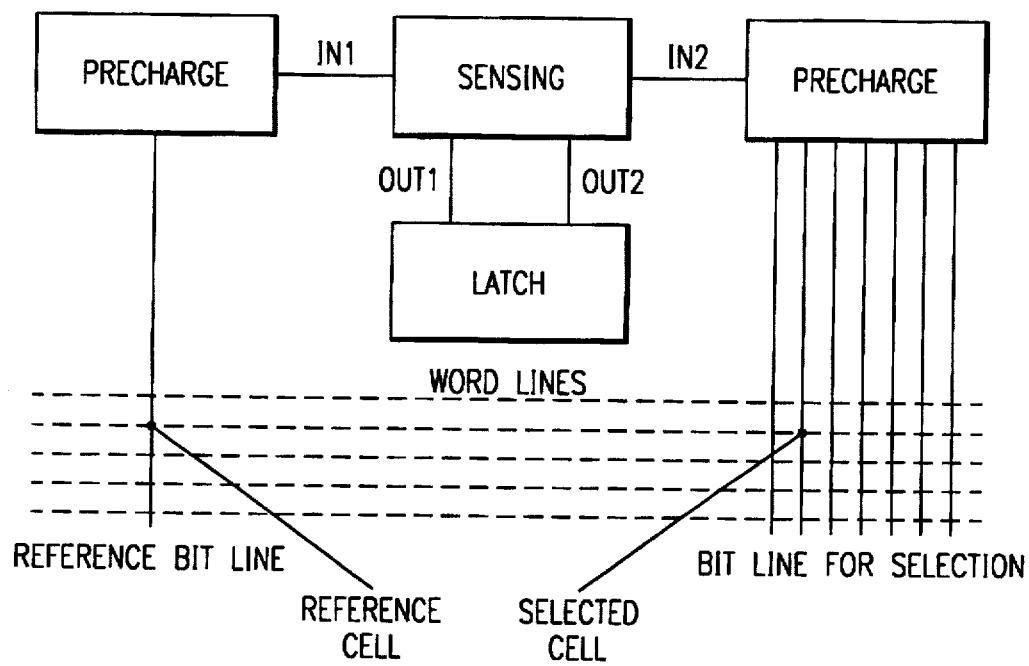
FIG. 3 is a block diagram of circuit portions for memory reading by the reference cell technique.

The output signal will be a voltage resulting from conversion of the current by the transistors L1 and L2. The output nodes, denoted by out1 and out2 in FIG. 3, will drive the next stage, represented by a latch or a differential amplifier. The two transistors L1 and L2 should be so sized as to allow the voltage thus obtained to suitably drive the next stage.

As for the application to reference-cell reading, the amplification is triggered by a variation in current at just the diode D1 or at both diodes D1 and D2.

As mentioned, the reading of a high-threshold cell is privileged over that of a low-threshold cell. In the former case, in fact, the nominal current of the reference cell is flowed through the diode D1, and no current is flowed through D2, whereas in the latter case, the same current is flowed through both diodes.

In the latter case, an amplifier having two identical legs is triggered by two currents which are also identical, and this would tend to evolve in a random way in either direction according to the amount of mismatch, or unpredetermined inequality, that may occur between the transistor thresholds, their dimensions, or even due to the lengths of the connection wire leads contributing different capacitances and resistances.

A better operation can be provided instead by having the amplifier unbalanced through the following steps:
comparison between the reference cell and the selected high-threshold cell to produce an amount of unbalance in the amplifier with the left-hand leg saturated, that is maximum current through this leg and no current through the right-hand leg; and
comparison between the reference cell and the selected low-threshold cell to produce an amount of unbalance in the amplifier with the right-hand leg saturated.

In fact, in order to cause the current amplifier to become unbalanced independently of the cell thresholds, the current contribution from the reference cell would have to be less than that from the selected cell, or conversely, the contribute from the selected cell would have to be higher than that from the reference cell. However, at high levels of integration, both cells are a minimum size and, therefore, their currents are substantially identical. Thus, it is necessary to work on the amplifier itself if correct reading is to be ensured under any conditions.

A solution that can suit a circuit according to the invention is one of unbalancing the amplifier using two MOS transistors with different dimensions as active amplifying elements (T1 and T2). In particular, since the aim is to obtain a larger current contribution from the selection leg, the transistor T2 will be made more conductive by increasing the width of its channel while keeping its length constant.

By this arrangement, upon triggering, there will be a contribution within the current amplifier already unbalanced; for a given signal current from the two inputs in1 and in2, the initial current through the right-hand leg will be higher than that through the left-hand leg, and this results in a further increase of the same through the leg which contains T2 and a decrease through the leg which contains T1.

As for the transistors SW1 and SW2, these only serve, as previously mentioned, the function of disabling the amplifier when CK is high, and accordingly, are still held identical of each other, as are the load transistors of the amplifier L1 and L2.

Thus, the single unbalanced or unmatched elements in the circuit are T1 and T2; the remainder (components, connection lines, parasitic elements) are matched. It pays to select for unbalance the transistors T1 and T2, rather than the diodes D1 and D2, because it is the amplifier that need be unbalanced, not the input stage; in addition, the transistors T1 and T2 form the amplifying elements proper of the circuit, that is, they are primarily responsible for the regenerative phenomenon exploited to saturate one of the two legs.

In both applications, the transistors SW1 and SW2, as the current amplifier disabling elements, will operate in the triode zone when on. The voltage drop across these two transistors (i.e., between their drains and sources) is extremely small, thereby allowing the circuit to also operate on low supply voltages. The transistors SW1 and SW2, being active in the triode zone, also function as degenerative impedances during the sensing step.

The transistors L1 and L2 are instead both current amplifier disabling and loading elements, and the fact that the same elements act to disable and load the amplifier implies a smaller number of serially connected elements between the power supply and ground, with further improvements in terms of dynamic range.

Thus, the use of a read circuit according to the invention will facilitate the attainment of a reduction of up to 3 volts in the supply voltage requirements.

It matters to further observe that in a circuit according to the invention, as shown in FIG. 4, the bit line capacitances will not burden the source electrodes of the amplifying transistors T1 and T2 directly. By an appropriate design of the circuit (e.g., using cascode structures), it becomes possible to uncouple such capacitances from the actual input nodes of the sensing circuit. The use of such structures allows, in fact, the voltages at the bit lines to be held substantially constant during a sensing operation and, hence, their capacitive load to be "cancelled".

Thus, the nodes in1 and in2 of the current amplifier would only be loaded with the gate capacitances of the elements T1, D1 and T2, D2, respectively. As a result, a faster response of the circuit to a current pulse, and hence a higher reading speed, can be provided.

A read circuit according to the invention is particularly adapted for high-speed reading at a low supply voltage.

The reduced number of components connected in series between the power supply and ground allows it to be operated on supply voltages below 5 volts (e.g., on 3 volts). The arrangement further affords a high memory cell reading speed in that it allows the bit line capacitances to be "uncoupled" from the sensing circuit proper. In the reference cell embodiment, the invention is particularly adapted for implementation on large size devices using cell arrays with as many as 4 or 16 million cells.

Of course, modifications and substitutions may be made unto the circuit of this invention illustrated herein, in ways well known to the skilled ones.

We claim:
1. A memory read circuit for developing an output signal from a complementary pair of signal inputs, comprising:
two legs each connected between a positive supply voltage and a ground voltage;
each said leg consisting of a series connection of a clocked PMOS switch, an active element, and a switched PMOS load element; both said PMOS switches, and both said PMOS load elements, having gates thereof connected to a common clock signal;

said legs having said respective active elements thereof cross-coupled in a latch configuration to form a voltage amplifier; and first and second input circuit elements, each connected to provide a load to one of the pair of complementary signal inputs, and to provide a corresponding voltage to a gate terminal of a respective one of said active elements.

2. The circuit of claim 1, wherein said input circuit elements each comprise a diode-connected transistor having a respective drain terminal thereof connected to a respective one of the signal inputs and to a respective gate terminal of the active element.

3. The circuit of claim 1, wherein said positive supply voltage is less than 5 Volts.

4. A memory read circuit for developing an output signal from a complementary pair of signal inputs, comprising:

a first pair of PMOS transistors clocked by a first clock signal;

a second pair of PMOS transistors cross-coupled to form a latch;

a third pair of PMOS transistors clocked by said first clock signal;

said first, second, and third transistor pairs being mutually connected in two circuit legs between a positive supply voltage and a ground voltage, each said leg consisting of one respective transistor of said second pair of transistors, interposed between one respective transistor of said first pair of transistors and one respective transistor of said third pair of transistors; and first and second input circuit elements, each connected to provide a load to one of the pair of complementary signal inputs, and to provide a corresponding voltage to a gate terminal of a respective one of said second pair of transistors.

5. The circuit of claim 4, wherein said input circuit elements each comprise a diode-connected transistor having a respective drain terminal thereof connected to a respective one of the signal inputs and to a respective gate terminal of the second pair of transistors.

6. The circuit of claim 4, wherein said positive supply voltage is less than 5 Volts.

\* \* \* \* \*